US008860284B1

(12) United States Patent
Fahimi et al.

(10) Patent No.: US 8,860,284 B1
(45) Date of Patent: Oct. 14, 2014

(54) PIEZOELECTRIC MULTIPLEXER

(71) Applicant: 19th Space Electronics, Dallas, TX (US)

(72) Inventors: Babak Fahimi, Arlington, TX (US); Daniel Christopher Dial, Shelton, WA (US)

(73) Assignee: 19th Space Electronics, Dallas, TX (US)

( * ) Notice: Subject to any disclaimer, the term of this patent is extended or adjusted under 35 U.S.C. 154(b) by 0 days.

(21) Appl. No.: 14/048,981

(22) Filed: Oct. 8, 2013

(51) Int. Cl.
  *H01L 41/08* (2006.01)
  *H01H 57/00* (2006.01)

(52) U.S. Cl.
  CPC ..................... *H01H 57/00* (2013.01)
  USPC ........... 310/332; 310/330; 310/331; 310/319; 310/328

(58) Field of Classification Search
  USPC ............ 310/328, 330–332, 319, 316.01, 317, 310/311
  See application file for complete search history.

(56) References Cited

U.S. PATENT DOCUMENTS

| 3,365,592 | A | * | 1/1968 | Krautwald et al. | 310/331 |
| 4,099,211 | A | * | 7/1978 | Hathaway | 310/332 |
| 5,598,050 | A | * | 1/1997 | Bowen et al. | 310/331 |
| 7,355,325 | B2 | * | 4/2008 | Johansson et al. | 310/330 |

OTHER PUBLICATIONS de Vries, J.W.C, et al: "Co-Fired Piezoelectric Multilayer Transformers," Proceedings of the Tenth IEEE International Symposium on Applications of Ferroelectrics, vol. 1, pp. 173-176, Aug. 18-21, 1996.
Dongwon, Kwon: "A 2-um BiCMOS Rectifier-Free AC-DC Piezoelectric Energy Harvester-Charger IC,"IEEE Transactions on Biomedical Circuits and Systems, vol. 4, No. 6, pp. 400-409, Dec. 2010.
Funakubo, T., et al "Ultrasonic Linear Motor Using Multilayer Piezoelectric Actuators," Jpn. J. Appl. Phys., vol. 34, pp. 2756-2759, 1995.
Huang, C., et al: "Study on the tip-deflection of a piezoelectric bimorph cantilever in the static state," Journal of Micromechanics and Microengineering, IOP Science, vol. 14, No. 4, pp. 530-534, Apr. 2004.
Kawashima, S, et al: Third Order Longitudinal Mode Piezoeletric Ceramic Transformer and Its Application to High-Voltage Power Inverter, IEEE Ultrasonics Symposium Proceedings, pp. 525-530, Oct. 31, 1994-Nov. 3, 1994.

(Continued)

*Primary Examiner* — Thomas Dougherty
*Assistant Examiner* — Karen B Addison
(74) *Attorney, Agent, or Firm* — Gardere Wynne Sewell LLP; Andre M. Szuwalski

(57) ABSTRACT

A piezoelectric multiplexer includes an actuator and multiple bimorph beams. The actuator includes an actuator conducting head and an actuator stem, and each bimorph beam includes a conducting beam contact head and a beam stem manufactured out of bimorph material. A control voltage is selectively applied to electrical contacts coupled to the beam stems to create a piezoelectric effect that bends the selected bimorph beam and creates an electrical connection between its contact head and the conducting head of the actuator. A control circuit with a controller signals which bimorph beam to connect to the actuator. This multi-bimorph-beam piezoelectric multiplexer can be affixed to the electrical terminals of different electrical components (e.g., a transistor) to create an electrical cell that can be manufactured on a semiconductor chip or in a microelectromechanical system (MEMS) device.

30 Claims, 9 Drawing Sheets

(56) References Cited

OTHER PUBLICATIONS

Navas, J, et al: "Miniaturised Battery Charger using Piezoelectric Transformers," Applied Power Electronics Conference and Exposition, Sixteenth Annual IEEE, vol. 1, pp. 492-496, APEC 2001.

Simonov, A.N., et al.: "Piezoelectric Deformable Mirror With Adaptive Multiplexing Control," Optical Engineering, Jul. 2006, vol. 45(7) (3 pages).

Smits, J.G., et al: "Constituent Equations of Piezoelectric Heterogeneous Bimorphs," Ultrasonics, Ferroelectrics, ad Frequency Control, vol. 38, No. 3, pp. 256-270, May 1991.

Smits, Jan G., et al: "The Constituent Equations of Piezoelectric Bimorphs," Ultrasonics Symposium, 1989. Proceedings, IEEE 1989, vol. 2, 3-6, pp. 781-784, Oct. 1989.

Song, Hong et al: "Multiplexing Control of a Multichannel Piezoelectric Deformable Mirror," 5th International Workshop on Adaptive Optics for Industry and Medicine, Proc. of SPIE vol. 6018, 60181F, 2005 (10 pages).

Uchino, Kenji, et al: "Ultrasonic Linear Motors Using a Multilayered Piezoelectric Actuator," Ferroelectrics, vol. 87, pp. 331-334, 1988.

Vasic, D., et al: "A new MOSFET & IGBT Gate Drive Insulated by a Piezoelectric Transformer", IPower Electronics Specialists Conference, IEEE 32nd Annual, vol. 3, pp. 1479-1484, Jun. 17-21, 2001.

Wang, Qing-Ming et al: "Electromechanical Coupling and Output Efficiency of Piezoelectric Bending Actuators," IEEE Transactions on Ultrasonics, Ferroelectrics, and Frequency Control, vol. 46, No. 3, pp. 638-646, May 1999.

Wang, Qing-Ming, et al: "Nonlinear piezoelectric behavior of ceramic bending mode actuators under wrong electric fields," Journal of Applied Physics, vol. 86, No. 6, pp. 3352-3360, Sep. 15, 1999.

Yang, Song-Ling, et al: "Fabrication of High-Power Piezoelectric Transformers Using Lead-Free Ceramics for Application in Electronic Ballasts," IEEE Transactions on Ultrasonics, Ferroelectrics, and Frequency Control, vol. 60, No. 2, pp. 408-413, Feb. 2013.

Yao, Kui, et al: "Compact Piezoelectric Stacked Actuators for High Power Applications," IEEE Transactions on Ultrasonics, Ferroelectrics, and Frequency Control, vol. 47, No. 4, pp. 819-825, Jul. 2000.

Zaitsu, T, et al: "New Piezoelectric Transformer Converter for AC-adapter," Applied Power Electronics Conference and Exposition, APEC '97 Conference Proceedings, Twelfth Annual, vol. 2, pp. 568-572, Feb. 23-27, 1997.

\* cited by examiner

PIEZOELECTRIC MULTIPLEXER

BACKGROUND

Piezoelectric materials deform when an external voltage is applied to them. Such materials are often called "bimorph materials." When the external voltage is applied, a piezoelectric effect takes place as a result of the crystal lattice structure of bimorph materials. Crystals generally have a charge balance where negative and positive charges precisely cancel each other out along the rigid planes of the crystal lattice. When this charge balance is disrupted by applying physical stress to a crystal, the energy is transferred by electric charge carriers, creating a current in the crystal. With the converse piezoelectric effect, application of an external electric field to the crystal disrupts the neutral charge state, resulting in mechanical stress and readjustment of the lattice structure. This mechanical stress and readjustment causes the bimorph material to physically move in one or more directions.

One electrical component that does not currently exploit the piezoelectric effect is the transistor. Transistors are the fundamental switching and amplification elements of modern electronic circuitry. Like other electrical components, transistors have capacity limits, including maximum current ratings, breakdown voltages and power-dissipation ratings. When these ratings are exceeded, the transistor will not function properly. This requires the transistors selected for a given circuit to be able to handle the voltage and current demands of the circuit's most demanding loads. For example, if a circuit includes a load drawing 15A of current, a transistor in the circuit must function properly at 15A. Higher voltage and current capacity transistors are generally more expensive than lower capacity counterparts. Also, when a transistor is not switched on, it is merely taking up space on a semiconductor chip.

SUMMARY

This Summary is provided to introduce a selection of concepts in a simplified form that are further described below in the Detailed Description. This Summary is not intended to identify key or essential features of the claimed subject matter, but instead is provided to illustrate different embodiments.

One embodiment is directed to a piezoelectric switching element, referred to herein as a "piezoelectric multiplexer," that includes an actuator and a plurality of parallel bimorph beams. The actuator includes a conducting head fashioned out of a conducting material and a non-conducting actuator stem. Each bimorph beam has a contact head similarly fashioned out of a conducting material and a beam stem manufactured out of a bimorph material. The bimorph contact heads are electrically coupled to various circuit voltage or current supplies and can be selectively brought in contact with the actuator's conducting head through application of a control voltage by a control circuit. The control voltage is strong enough to create a piezoelectric effect in the bimorph stems, thereby causing the bimorph beam to move (or bend) toward the actuator and bring one of the contact heads into contact with the conducting head of the actuator. The contact and conducting heads, both being made from conducting material, create an electrical connection when they are touching. The electrical connection allows voltage and current to pass through the touching heads.

In one embodiment, the actuator and bimorph beams of the piezoelectric multiplexer are positioned on top of a dielectric layer of a semiconductor chip, with the conducting and contact heads oriented atop upright stems of the actuator and bimorph beams. In one embodiment, the actuator is centered in the middle of a geometric pattern of bimorph beams. The bimorph beams may form a triangle, circle, square, rectangle, trapezoid, pentagon, hexagon, or other geometric shape around the actuator.

Another embodiment is directed to a cell with multiple piezoelectric multiplexers coupled to different terminals of an electrical component. Two piezoelectric multiplexers may be coupled to a two-terminal component (e.g., a diode), three piezoelectric switching elements may be coupled to a three-terminal component (e.g., a transistor), four piezoelectric multiplexers may be coupled to a four-terminal component (e.g., a bridge converter), and so on. One specific embodiment relates to a transistor with its collector, base and emitter (or source, base and drain) terminals connected to different piezoelectric multiplexers.

Another embodiment is directed to a piezoelectric multiplexer with an actuator surrounded by groups of bimorph beams that are selectively made to the bend into contact with the actuator. Each group includes two or more bimorph beams that have contact heads made of a conducting material and a lower bimorph stem made of a bimorph material. Instead of just moving one bimorph beam at a time, a control voltage is selectively applied to groups of bimorph beams to increase the chances that at least one bimorph beam comes into contact with the actuator.

BRIEF DESCRIPTION OF THE DRAWINGS

Embodiments are illustrated by way of example in the accompanying figures wherein.

DETAILED DESCRIPTION

Embodiments described herein generally related to a piezoelectric multiplexer with a single actuator and multiple bimorph beams that can be selectively bent, by applying a control voltage, to bring contact heads attached to the_ bimorph beams in contact with a conducting head of the actuator. In one embodiment, the actuator is positioned parallel to the bimorph beams, with an actuator stem connected to an actuator conducting head made of copper, aluminum, or some other conducting material. The bimorph beams are positioned parallel to the actuator stem with each beam, in one embodiment, positioned upright and having a bimorph beam stem connected to a beam contact head made of a conducting material (e.g., copper, aluminum, etc.). The control voltage can be applied across any of the bimorph beams and the actuator to cause a piezoelectric effect that makes the selected bimorph beam bend enough to bring the beam contact head in to contact with the actuator conducting head. The two connected heads create an electrical connection through which current can flow and that can be disconnected by withdrawal of the control voltage. Any of the bimorph beams can be brought in to contact with the actuator through the selective application of the control voltage.

Figure 1:
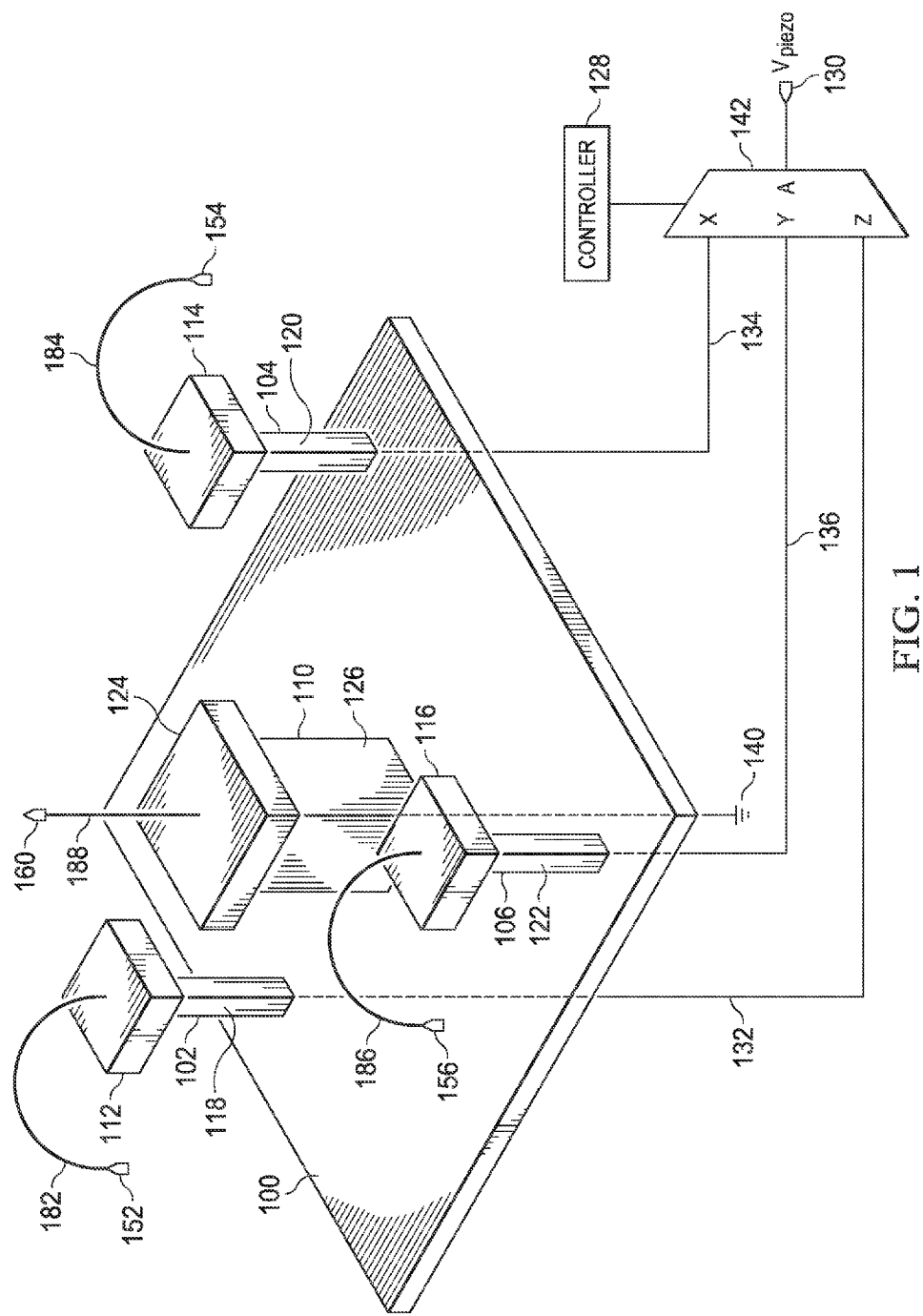
FIG. 1 is a three-dimensional (3D) diagram of a piezoelectric multiplexer with bimorph beams surrounding an actuator.

FIG. 1 is a 3D diagram of a piezoelectric multiplexer 100 that has three bimorph beams 102, 104 and 106 positioned upright and parallel to an actuator 110. The bimorph beams 102, 104 and 106 each respectively include contact heads 112, 114 and 116 made of a conducting material (e.g., copper, aluminum, etc.) and bonded to lower stems 118, 120 and 122 made of a bimorph material (e.g., lead zirconate titanate or the like). Actuator 110 includes a conducting head 124 fashioned out of a conducting material and a lower stem 126 made out of an insulating material. In one embodiment, the bimorph beams 102, 104 and 106 stand upright parallel to the actuator 110. In another embodiment, the bimorph beams 102, 104 and 106 rest against a barrier that pre-bends them toward the actuator 110.

The bimorph material in the lower stems 118, 120 and 122 allows for the creation of a piezoelectric effect in the bimorph beams 102, 104 and 106 through the selective application of a control voltage (Vpiezo 130) by way of underlying contacts 132, 134 and 136. In one embodiment, the underlying contacts 132, 134 and 136 are coupled to the lower stems 118, 120 and 122 of bimorph beams 102, 104 and 106 through a metallization or dielectric layer—the latter being through a connecting via or pathway—of a semiconductor chip or microelectromechanical system (MEMS).

In one embodiment, actuator 110 is tied to ground 140, and Vpiezo 130 can be applied to any of the underlying contacts 132, 134 and 136 of the bimorph beams 102, 104 and 106. Vpiezo 130, when applied, produces a piezoelectric effect in the bimorph material of selected bimorph beams 102, 104 or 106 that causes the stem 118, 120 or 122 of the selected beam to mechanically bend toward the actuator 110 and bring one of contact heads 112, 114 and 116 in to contact with the conducting head 124. For example, applying Vpiezo 130 to bimorph beam 102 will cause stem 118 to bend until contact head 112 touches conducting head 124. Connecting one of the contact heads 112, 114 and 116 with conducting head 124 creates an electrical connection between the two that allows current received at the selected contact head 112, 114 and 116 to pass through the conducting head 124. This allows the piezoelectric multiplexer 100 to connect any of the contact heads 112, 114 or 116 to the conducting head 124 of actuator 110.

While the dimensions of the bimorph beams may vary, one embodiment uses lower stems having a height of 2500 µm, length of 1000 µm, and width of 150 µm. This embodiment includes copper contact heads with a height of 1000 µm, length of 1400 µm, and width of 150 µm. These dimensions produce a 37.085 µm deflection toward actuator 110 in 8.4 ms time at a current of 6.2 A, voltage of 111.26V, and power dissiption of 689.78 W. Of course, these results are specific to just one embodiment, but they are provided nonetheless to illustrate some physical and electrical characteristics.

In the illustrated embodiment, Vpiezo 130 is supplied to a 1-to-3 demultiplexer 142 as input A passed to one of three demultiplexer outputs X, Y or Z that are respectively connected to underlying contacts 134, 136 and 132. A selection signal from a controller 128 selects the demultiplexer output for Vpiezo 130, and the selection signal is generated by a controller 128 that can be changed either programmatically or by a user.

Controller 128 may be any type of microcontroller, microprocessor, digital signal processor (DSP) with access to non-transitory computer-readable media embodied with computer-executable instructions that, when executed, signal the selection of either output X, Y or Z. For purposes of embodiments discussed herein, computer-readable media includes memory in the form of volatile and/or nonvolatile memory, such as, for example, random access memory (RAM), read-only memory (ROM), flash memory, cache, or the like. Computer-readable media does not, however, include propagation signaling or other types of carrier waves for transmitting data.

In one embodiment, controller 128 provides demulitplexer 142 with binary values selecting one of the demultiplexer outputs X, Y, or Z of demultiplexer 142. For example, the control signal may include two binary numbers, with a binary value of "00" corresponding to demultiplexer output X, "01" corresponding to demultiplexer output Y, and "11" corresponding to demultiplexer output Z. Those skilled in the art will understand that selection of the demultiplexer 142 output for Vpiezo 130 can be performed in numerous other ways, but such techniques need not be discussed at length herein.

While only three bimorph beams 102, 104 and 106 are shown surrounding actuator 110, alternative embodiments may include any number of bimorph beams around actuator 110. In addition to varying the number of bimorph beams, the beams' orientation relative to actuator 110 may also vary in different embodiments, such as, for example, being positioned around actuator 110 in a triangular, square, rectangular, circular, trapezoidal, pentagonal, hexagonal, or other type of geometric pattern. For example, six bimorph beams may surround actuator 110 in a hexagonal pattern, or ten bimorph beams may surround actuator 110 in a circular pattern. Alternatively, the bimorph beams may be positioned to just one side of (instead of around) actuator 110. In still another embodiment, the bimorph beams 102-106 and actuator 110 may be oriented downward or horizontally instead of upright.

Because the contact heads 112, 114 and 116 and conducting head 124 are each manufactured from a conducting material (e.g., copper, aluminum, etc.), an electrical connection is made by connecting one of the contact heads 112, 114 and 116 to the conducting head 124, allowing current to freely pass through the connection without potentially being hindered by a switching element's voltage or current capacity. Thus, all that is needed to switch piezoelectric multiplexer 100 between different contact heads 112, 114 and 116 is control voltage Vpiezo 130. Vpiezo 130 can be applied to any of the bimorph beams 102-106, providing the ability to quickly switch between different voltage, current, or power sources connected to the different contact heads 112-116.

To connect the bimorph beams 102, 104 and 106 and the actuator 110 to other nodes of a circuit, one embodiment bonds electrical wiring to the contact heads 112, 114 and 116 and conducting head 124. Inputs 152, 154 and 156 represent three different connection points to various nodes of a circuit or to different voltage or current supplies. Wires 182, 184 and 186 are electrically bonded to the contact heads 112, 114 and 116, respectively, and are bendable so as not to break or restrict movement of the bimorph beams 102, 104 and 106 when they move toward actuator 110. When the bimorph beams 102, 104 and 106 are upright—or at least not being moved by applied Vpiezo 130—some slack forms in wires 182, 184 and 186 causing them to bend or bow between their respective contact head 182, 184 or 186 and input 152, 154 and 156. The illustrated embodiment shows wires 182, 184 and 186 bending upward; however, such slack may form in a downward or sideways direction to possibly save space in a semiconductor chip or a MEMS device. Also, a wire 188 is electrically bonded to the conducting head 124 to provide an electrical path from the actuator 110 to an output 160, which represents a connection point to other circuitry. When the bimorph beams' contact heads 112, 114 and 116 touch the actuator conducting head 124, an electrical path is created from the input 152, 154 or 156 through the selected contact head 112, 114 or 116 and the touching conducting head 124 through wire 188 to output 160.

To manufacture the piezoelectric multiplexer 100 in a chip, one embodiment couples the actuator 110 and bimorph beams 102, 104 and 106 to a dielectric layer with a conductive connection or connecting via extending to underlying contacts. Connecting vias may be formed through dielectric materials using various etching techniques, e.g., isotropic, anisotropic, or the like. Alternatively, embodiments may couple actuator 110; bimorph beams 102, 104 and 106; and their underlying contacts directly to one or more metallization layers in a semiconductor chip. The piezoelectric multiplexer may also be manufactured as a MEMS device.

Piezoelectric multiplexer 100 can replace conventional transistors or other switching elements in a circuit that must be capable of handling the voltage or current loads of other more demanding components of a circuit. By being able to selectively switch between multiple contact heads 112, 114 and 116 on the fly, the piezoelectric multiplexer 100 provides options for connecting terminals of electrical components to other circuitry or voltage/current supplies. This greatly benefits fault tolerance in chip manufacturing because if one of the supplies or circuits connected to a contact head 112, 114 or 116 is faulty or damaged, an alternate circuit or supply can be used by applying Vpiezo 130 across a non-faulty contact head.

Figure 2A:
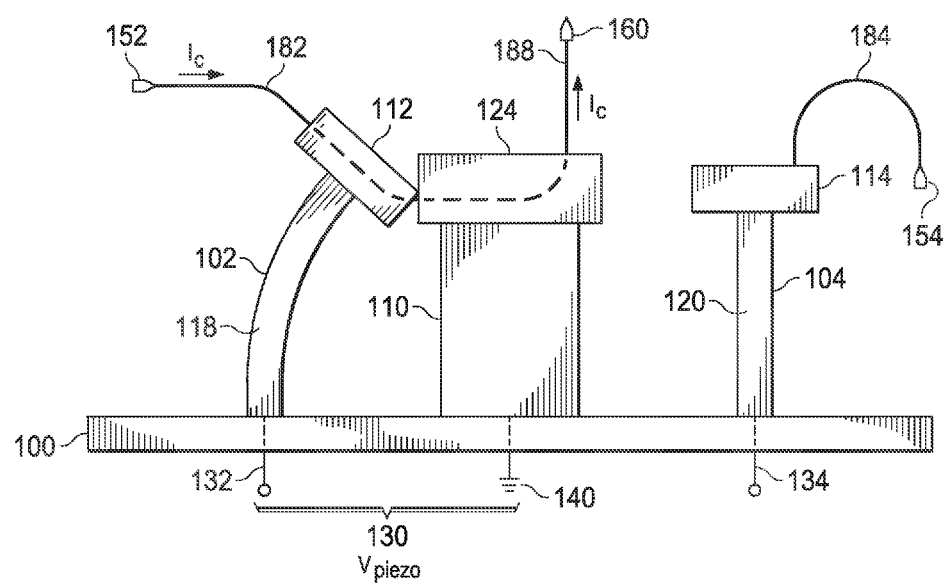
FIG. 2A is a cross-section diagram of a piezoelectric multiplexer with a control voltage being applied to cause a bimorph beam to contact an actuator.

FIG. 2A is a cross-section diagram of a piezoelectric multiplexer 100 with Vpiezo 130 being applied to cause bimorph beam 102 to contact actuator 110. Actuator 110 is situated between bimorph beams 102 and 104, which respectively include beam stems 118 and 120 coupled to contact heads 112 and 114. In the illustrated embodiment, Vpiezo 130 has been selectively applied across contact 132 of bimorph beam 102, and the grounded contact 140 of actuator 110. Vpiezo 130 causes a piezoelectric effect in bimorph beam 102 that bends this selected beam toward actuator 110. The piezoelectric-induced bending brings contact head 112 into contact with conducting head 124, thereby creating an electrical connection between bimorph beam 102 and actuator 110.

Vpiezo 130 may be applied to either underlying contact 132 or 134, and while the illustrated embodiment shows Vpiezo 130 applied just to contact 132, a similar piezoelectric effect can be created in bimorph beam 104 that creates an electrical connection between contact head 114 and conducting head 124. For the sake of clarity, the illustrated embodiment only shows two bimorph beams 112 and 114 positioned on opposite sides of actuator 110. As previously stated, embodiments may use any number of bimorph beams positioned either around or to the side of actuator 124. Also, contacts 132 and 134 are shown connected underneath a dielectric or metallization layer to the beam stems 118 and 120. These contacts may be connected to the sides of the lower stems 118 and 120, instead of underneath dielectric or metallization layers.

The electrical connection between bimorph beam 102 and actuator 110 allows an input current Ic to flow from input 152 through wire 182 to contact head 112, through contact head 112 and conducting head 124 (as indicated by the electrical path shown as a dotted line), and through wire 188 from actuator 124 to output 160. Wires 182 and 184 are bendable and long enough to enable bimorph beams 102 and 104 to reach actuator 110. When the bimorph beams 102 and 104 are not being moved toward actuator 110—i.e., are in the upright position—wires 182 and 184 will have some slack, in one embodiment. Such slack can be seen in wire 184 bowing upward.

Figure 2B:
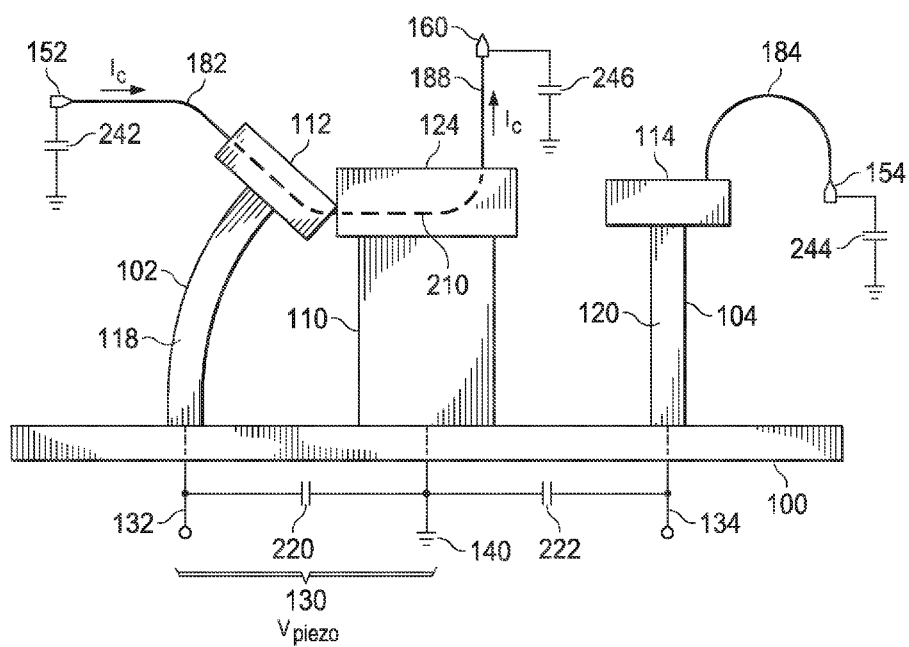
FIG. 2B is a cross-section diagram of a piezoelectric multiplexer with a control voltage being applied to cause a bimorph beam to contact an actuator.

Electrical discharges, or "arcing," may occur between the contact heads 112-116 and the conducting head 124 because the voltages at either may differ greatly enough to cause discharges across in between air gaps. Prevention of arcing is a very important task to increase the durability and lifetime of the contact heads 112-116 and conducting head 124. FIG. 2B illustrates one embodiment that strategically places capacitors to eliminate or reduce arcing. The illustrated embodiment shows a cross-section diagram of a piezoelectric multiplexer 100 with applied control voltage Vpiezo 130 applied to bimorph beam 102. Capacitors 220 and 222 are connected between contacts 132 and 134, respectively, and actuator contact 140. Capacitors 220 and 222 have a damping effect that increases the durability of the contact heads 112-116 and conducting head 124. Though FIG. 2B only shows two bimorph beams 102 and 104 with capacitors 220 and 222, embodiments may include capacitors connected between actuator contact 140 and each bimorph beam contact 132-136.

The embodiment also includes capacitors 242, 244 and 246 connected to input 152, input 154 and output 160, respectively. Capacitors 242, 244 and 246 are each tied ground and act as high-pass filters to dissipate transient voltages experienced at input 152, input 154 and output 160. Capacitors 242, 244 and 246 bring the voltages of input 152, input 154 and output 160 in to relative proximity of each other, and therefore reduce the likelihood of arcing.

Figure 2C:
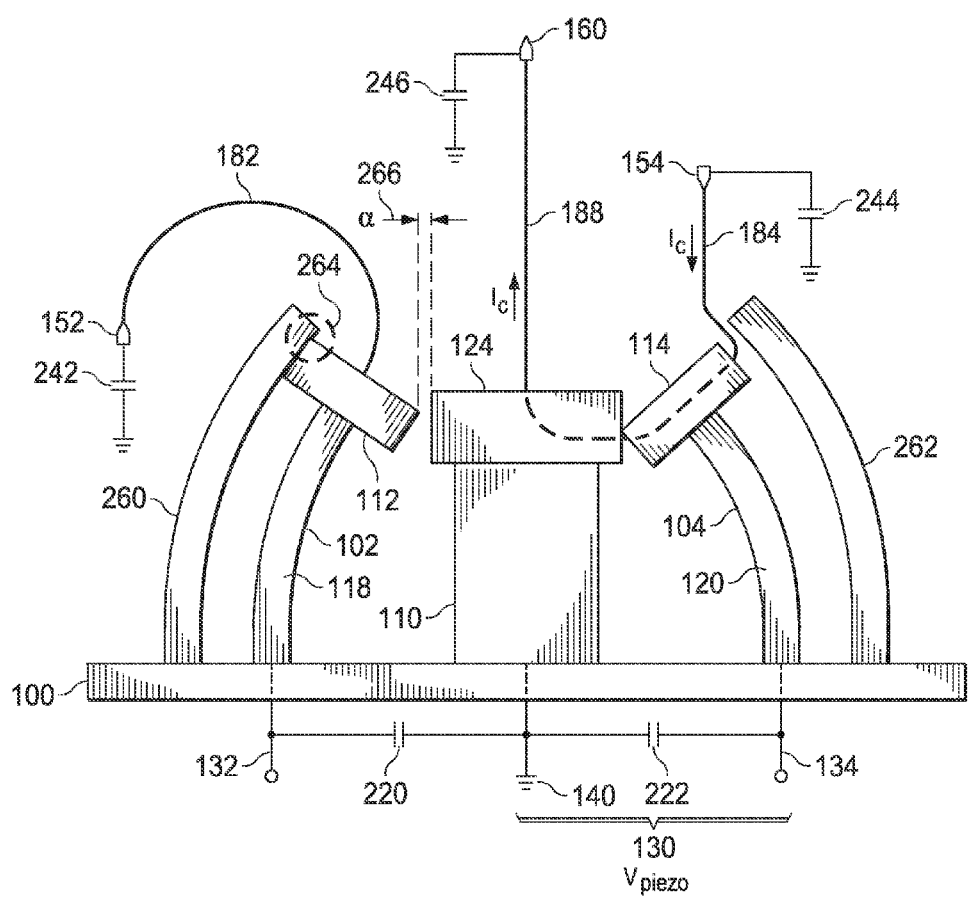
FIG. 2C is a cross-section diagram of a piezoelectric multiplexer with a control voltage being applied to cause a bimorph beam to contact an actuator and an outer barrier that forces another bimorph beam to bend toward the actuator.

FIG. 2C is a cross-section diagram of a piezoelectric multiplexer 100 with multiple barriers 260 and 262 that pre-bend the piezoelectric-material lower stems 120 and 118, respectively, to reduce the distance contact heads 114 and 112 need to travel to reach conducting head 124. The voltage necessary to bend each bimorph beam's lower stem and bring the contact heads 112-116 into contact with conducting head 124 varies based on the distance the contact heads 112-116 need to travel to the reach the conducting head 124. Larger voltages are needed to make the contact heads 112-116 traverse further distances. Barriers 260 and 262 are manufactured, in one embodiment, from an insulating material and are positioned to force bimorph beams 102-106 toward the actuator 110. In the illustrated embodiment, Vpiezo 130 applied to bimorph beam 104 causes contact head 114 to come into contact with conducting head 124. As a result, input current Ic flows from input 154, through wire 184, through touching contact head 114 and conducting head 124 (as shown by the dotted electrical path), and through wire 188 to output 160.

Bimorph beam 102 does not receive Vpiezo 130 to bend lower steam 118. As a result, bimorph beam 102 attempts to stand upright, but barrier 260 precludes it from doing so at point 264, forcing bimorph beam 102 to remain bent toward actuator 110. Being pre-bent moves contact head 112 closer to conducting head so that control voltage Vpiezo 130 only needs to be large enough to move the bimorph beam 102 a smaller distance (a) 266 to reach conducting head 124 than if the bimorph beam 102 were fully upright. Each bimorph beam 102-106 may have its own barrier, or a single barrier may surround or envelop all the bimorph beams 102-106. Moreover, arcing is reduced by underlying capacitors 220 and 222 and the high-pass filters are created by grounded capacitors 242, 244 and 246.

Figure 3A:
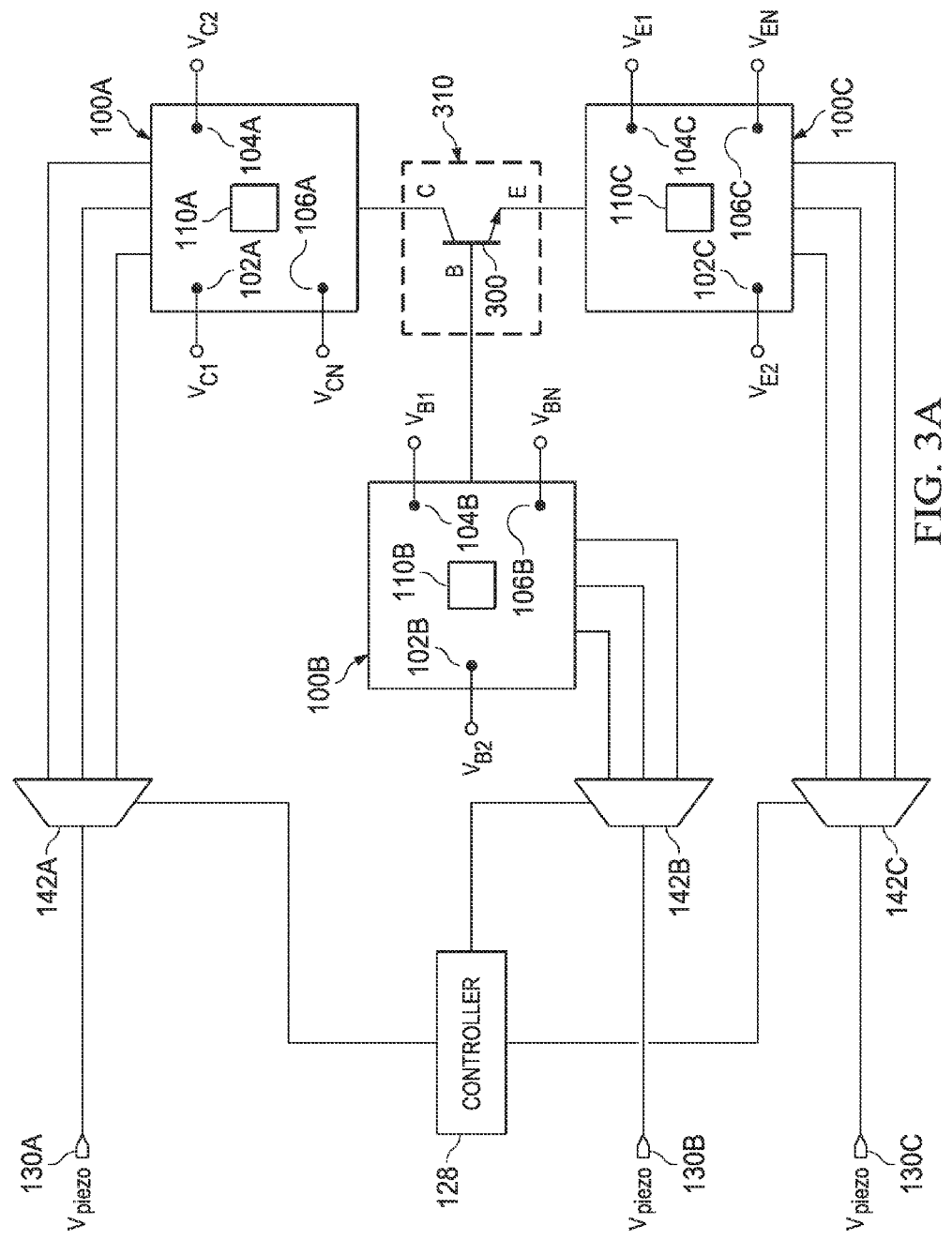
FIG. 3A is a diagram of a transistor with multiple piezoelectric multiplexers attached to separate terminals.

The piezoelectric multiplexer 100 controls voltage and current supplies to the multi-contact electrical components. FIG. 3A illustrates three piezoelectric multiplexers 100A-C respectively attached to the collector, base and emitter of an npn transistor 310. Bimorph beams 102A-C, 104A-C and 106A-C are connected to various voltage or current inputs, and actuators 110A-C are respectively coupled to the collector, base and emitter of transistor 310. The collector of transistor 310 can switch between $V_{C1}$, $V_{C2}$, $V_{CN}$; the base can switch between $V_{B1}$, $V_{B2}$, $V_{BN}$; and the emitter can switch between $V_{E1}$, $V_{E2}$, $V_{EN}$. Switching between the desired voltages is performed by applying control voltage Vpiezo 130A-C to bimorph beams of the piezoelectric multiplexers 100A-C. While FIG. 3A shows a bipolar junction transistor (BJT), transistor 310 may be any kind of transistor, such as, for example but without limitation, a field-effect transistor (FET), a metal-oxide-semiconductor FET (MOSFET), or the like.

A controller 128 sends selection signals to demultiplexers 142A-C, which pass Vpiezo 130A-C to demultiplexer outputs coupled to contacts of the selected bimorph beams 102A-C, 104A-C and 106A-C. For piezoelectric multiplexer 100A, control unit 128 may signal demultiplexer 142A to pass Vpiezo 130A to one of three contacts connected to bimorph beams 102A, 104A and 106A. Vpiezo 130A will cause the selected bimorph beam 102A, 104A or 106A to bend toward actuator 110A and thereby create an electrical connection that enables one of input voltages $V_{C1}$, $V_{C2}$, $V_{CN}$ to be supplied to the collector terminal of transistor 310. Vpiezo 130B will cause the selected bimorph beam 102B, 104B or 106B to bend toward actuator 110B and thereby create an electrical connection that enables one of input voltages $V_{B1}$, $V_{B2}$, $V_{BN}$ to be supplied to the base terminal of transistor 310. Vpiezo 130C will cause the selected bimorph beam 102C, 104C or 106C to bend toward actuator 110C and thereby create an electrical connection that enables one of input voltages $V_{E1}$, $V_{E2}$, $V_{EN}$ to be supplied to the emitter terminal of transistor 310.

A transistor cell can be manufactured that includes transistor 310 and one or all of piezoelectric multiplexers 100A-C connected to terminals of the transistor 310. The transistor cell is capable of switching between multiple sources at the collector, base and emitter terminals. This new transistor cell may be manufactured as a discrete component, in a semiconductor chip, or in a MEMS device. The transistor cell (i.e., transistor 310 and one or all of piezoelectric multiplexers 100A-C) enables multiple input combinations to the transistor 310, allowing it to effectively function as multiple transistors. As a result, the transistor 310 can continuously be used and switched between different configurations, instead of having to just sit idly and take up space on a chip or a MEMS device when reverse biased. When used in electrical devices (e.g., cell phone, medical device, power electronics, etc.), the transistor cell improves the fault tolerance of these devices by providing a programmatically selectable transistor that can switch to alternative transistor terminal inputs whenever faults are detected in circuitry. For example, the collector can switch to $V_{C2}$ whenever a fault is detected with $V_{C1}$.

The illustrated embodiments show input voltages selectively received at the collector, base, and emitter of transistor 310. Current may alternatively or additionally be received instead of voltage. Moreover, the bimorph beams 102C, 104C and 106C of piezoelectric multiplexer 100C for the emitter may be configured to not receive inputs but instead provide outputs to one of three different circuit connection points. So instead of receiving $V_{E1}$, $V_{E2}$, $V_{EN}$, bimorph beams 102C, 104C and 106C are each coupled to different circuit nodes, and the application of Vpiezo 130 selectively connects the emitter to one of the nodes. For the sake of clarity, however, embodiments are discussed herein as receiving voltage inputs, but embodiments fully contemplate receiving and providing voltage or current inputs and outputs.

Figure 3B:
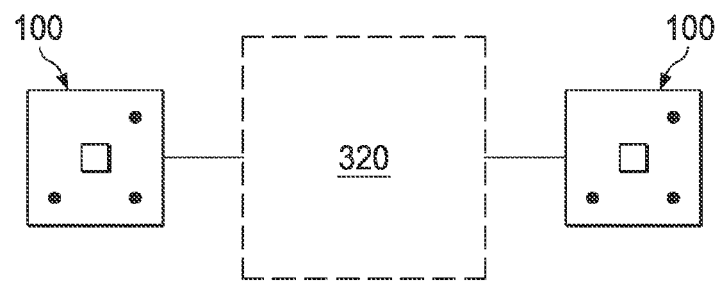
FIG. 3B is a block diagram of a two-terminal electrical component coupled to piezoelectric multiplexers.
Figure 3C:
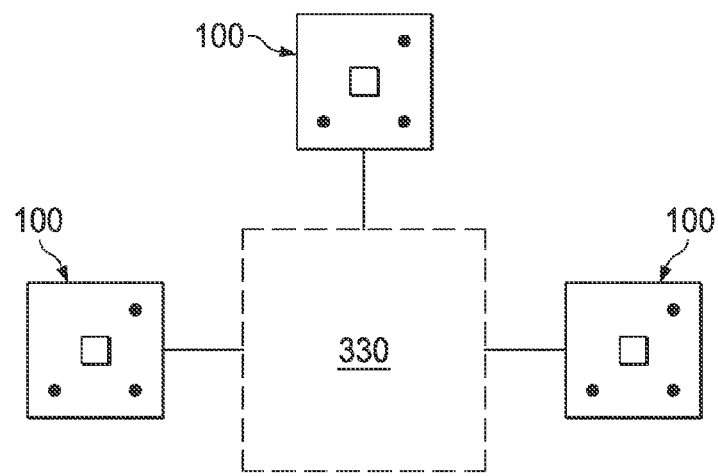
FIG. 3C is a block diagram of a three-terminal electrical component coupled to piezoelectric multiplexers.
Figure 3D:
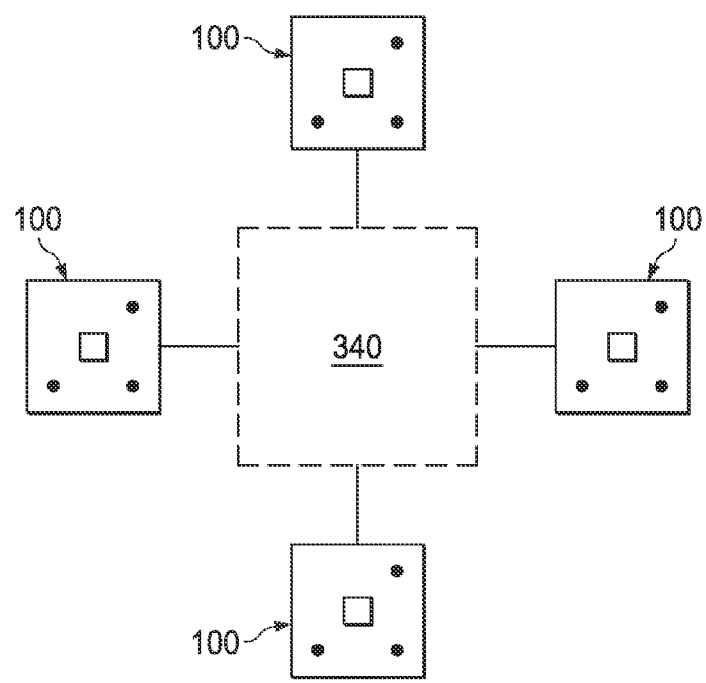
FIG. 3D is a block diagram of a four-terminal electrical component coupled to piezoelectric multiplexers.

Piezoelectric multiplexer 100 may be added to terminals of electrical components other than transistors to create other types of electrical component cells. FIG. 3B illustrates a block diagram of a cell with two piezoelectric multiplexers 100 electrically coupled to a two-terminal electrical component, such as a diode, a capacitor, an inductor, a resistor, a transformer, or the like. FIG. 3C illustrates a block diagram of a cell with three piezoelectric multiplexers 100 electrically coupled to a three-terminal electrical component, such as a transistor, thyristor, or the like. FIG. 3D illustrates a block diagram of a cell with four piezoelectric multiplexers 100 electrically coupled to a four-terminal electrical component, such as a transformer, bridge recitifier, DC-to-AC inverter, or the like. Though multi-terminal electrical components are shown, the piezoelectric multiplexer 100 can alternatively be used to switch between disparate loads of a circuit. For example, the piezoelectric multiplexer 100 can be used to switch application of a particular voltage from the nodes of one transformer to the nodes of another.

Figure 4A:
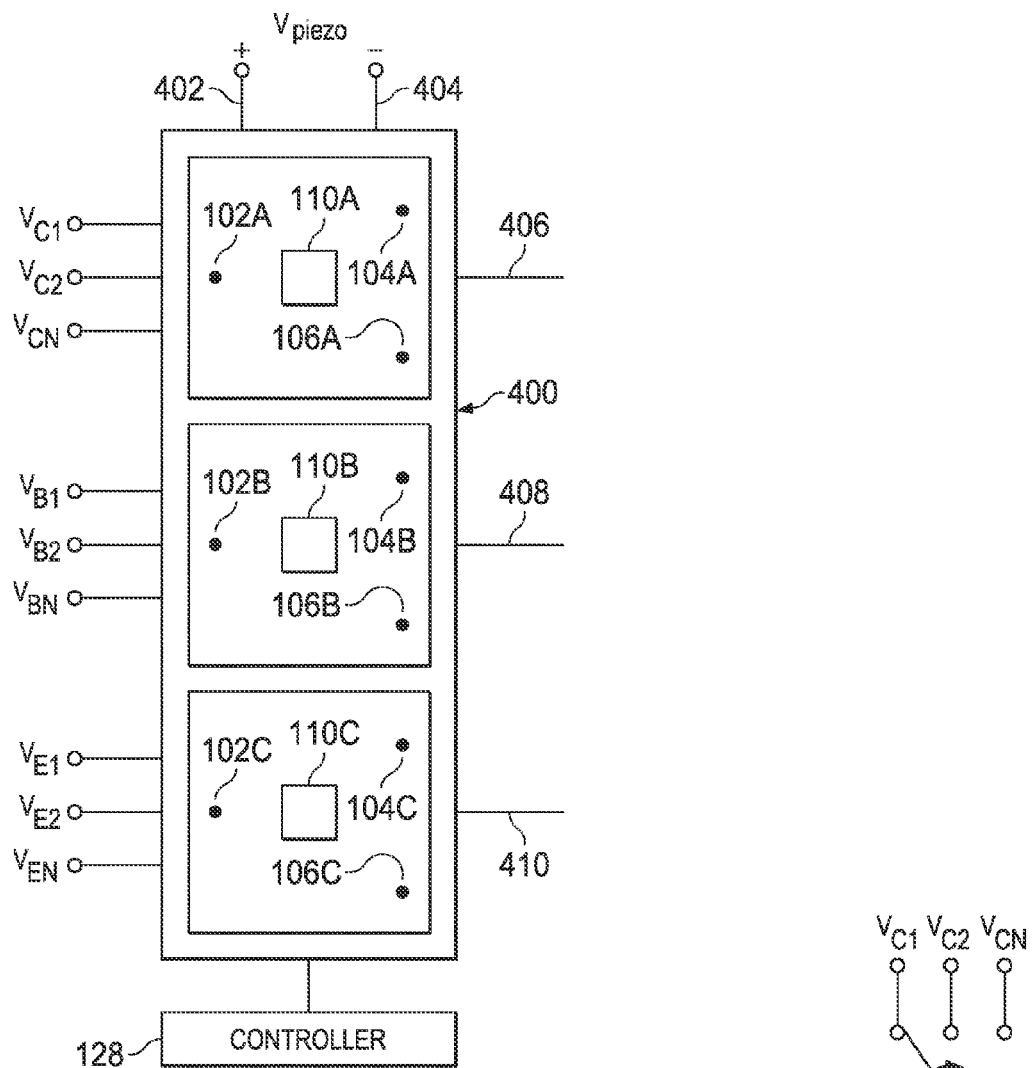
FIG. 4A is a block diagram of a transistor with multiple piezoelectric multiplexers.
Figure 4B:
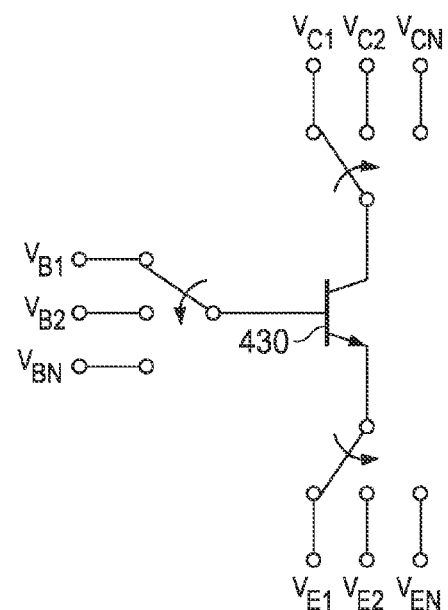
FIG. 4B is a schematic drawing of a transistor with multiple piezoelectric multiplexers providing the ability to switch between different terminal inputs.

FIG. 4A is a block diagram of a transistor cell with multiple piezoelectric multiplexers 100A-C embodied in a semiconductor chip 400. FIG. 4B the schematic functionality of the transistor cell embodied on the semiconductor chip 400 shown in FIG. 4A. Looking initially at FIG. 4A, the transistor cell receives three inputs for each piezoelectric multiplexer 100. Voltage inputs $V_{C1}$, $V_{C2}$, $V_{CN}$ are electrically coupled to bimorph beams 102A, 104A and 106A, respectively; voltage inputs $V_{B1}$, $V_{B2}$, $V_{BN}$ are electrically coupled to bimorph beams 102B, 104B and 106B, respectively; and voltage inputs $V_{E1}$, $V_{E2}$, $V_{EN}$ are electrically coupled to bimorph beams 102C, 104C and 106C, respectively. Actuators 110A-C are respectively coupled to the collector, base and emitter of the transistor 430.

The semiconductor chip 400 receives a control voltage Vpiezo across inputs 402 and 404, and Vpiezo is selectively applied to the bimorph beams by signaling of controller 128, which may communicate selection signals directly to the semiconductor chip 400 or through a demultiplexer 142. Controller 128 selects which bimorph beams should receive Vpiezo, and when Vpiezo is applied, the selected bimorph beam physically bends toward an actuator 110A, B or C, creating an electrical connection between one of the input voltages and a terminal of the transistor 430 shown in FIG. 4B. For example, the collector terminal is wired to the actuator 110A, and the controller 128 selects bimorph beam 102A connected to $V_{C1}$ to receive Vpiezo, causing bimorph beam 102A to bend in to contact with actuator 110A and thus connect $V_{C1}$ to the collector. In the same manner, the controller 128 can selectively connect the various bimorph beams of the collector, base and emitter to the different input voltages $V_{C2-CN}$, $V_{B1-BN}$ and $V_{E1-EN}$.

Chip connections 406-410 provide connection points to the terminals of the transistor cell on semiconductor chip 400.

Chip connections 406-410 are coupled to actuators 110A-C, respectively. FIG. 4B illustrates the transistor cell 430 schematically. The collector, base and emitter can selectively switch between different voltage inputs. FIGS. 4A and 4B show only one embodiment in which piezoelectric multiplexers are connected to a three-terminal BJT. Similar cells and semiconductor chips can be fabricated for other types of transistors (e.g., FET), as well as other multi-terminal (e.g., two-, three-, four-terminal, and the like) electrical components.

Figure 5:
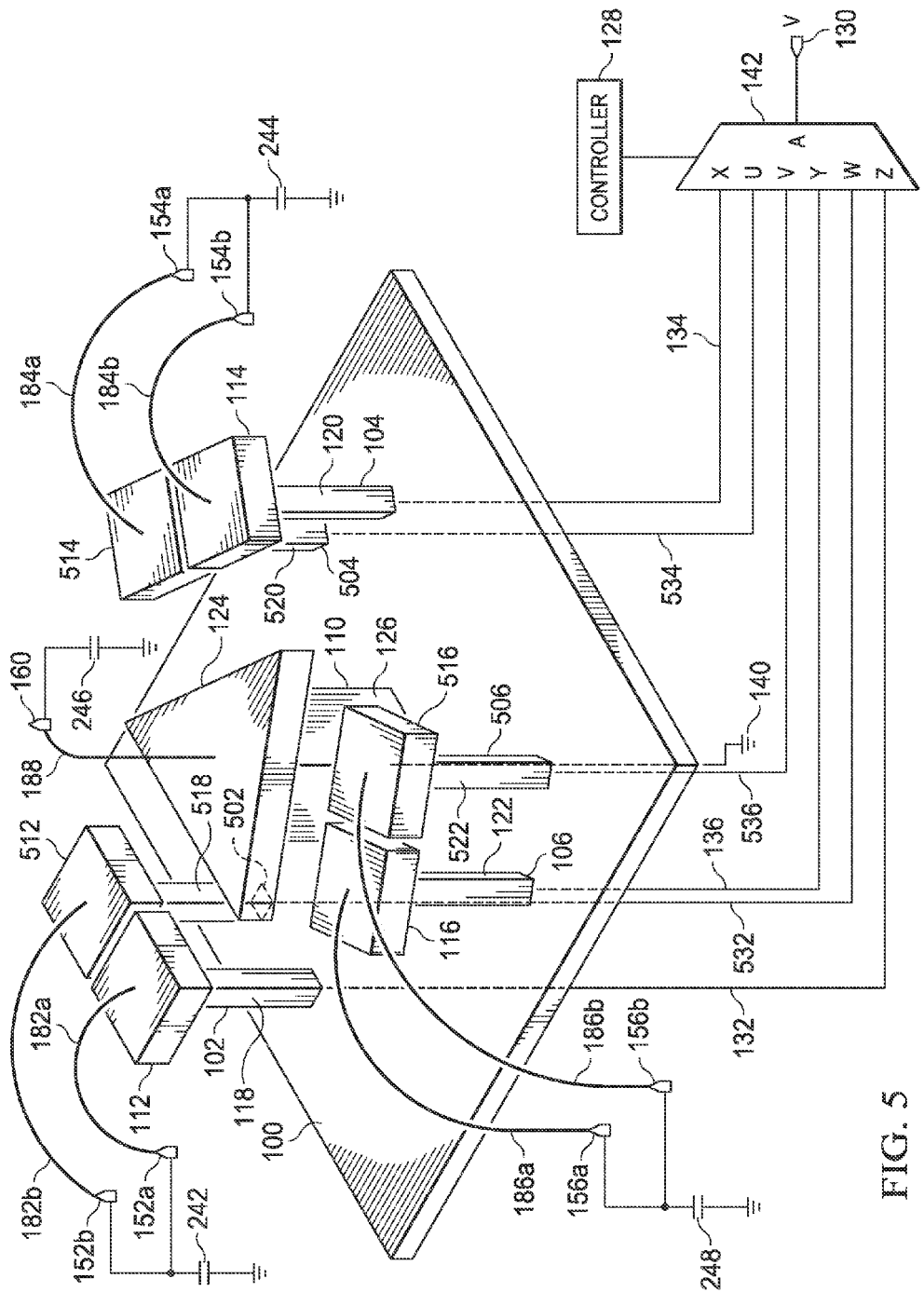
FIG. 5 is a three-dimensional (3D) diagram of a piezoelectric multiplexer with pairs of bimorph beams surrounding an actuator.

FIG. 5 is a three-dimensional (3D) diagram of a piezoelectric multiplexer with pairs of bimorph beams 102-106 and 502-506 surrounding an actuator 110. Each pair of bimorph beams 102/502, 104/504 and 106/506 can be bent toward actuator 110 by controller 128 selectively applying control voltage Vpiezo 130 to the pair's underlying contacts 132-136/532-536. Bimorph beams 102-106 include contact heads 112-116 and lower bimorph stems 118-122. Likewise, paired bimorph beams 502-506 include contact heads 512-516 and bimorph stems 518-522. Instead of just one bimorph beam 102-106, the shown embodiment moves a selected pair of bimorph beams 102/502, 104/504 or 106/506 in to contact with the conducting head 124 of actuator 110. For example, instead of just moving bimorph beam 102 toward actuator 110, Vpiezo 130, which is received by demultiplexer 142 and is applied to demultiplexer outputs W and Z connected to beam contacts 132 and 532, causes bimorph beams 102 and 502 to move into contact with the conducting head 124. The same can be done for bimorph beam pairs 104/504 and 106/506 through selective application of Vpiezo 130 through demultiplexer outputs X/U and Y/V, which are respectively connected to beam contacts 134/534 and 136/536. Use of bimorph beam pairs 102/502, 104/504 and 106/506 provides a fail-safe mechanism to ensure that at least one bimorph beam comes into contact with conducting head 124. Should one bimorph beam be faulty or damaged, the other in the selected pair will provide a connection. Embodiments are not particularly limited to pairs of bimorph beams, as some embodiments will instead include triplets, quadruplets, or other groupings of bimorph beams. Though, the larger the number of bimorph beams, the more chip or MEMS space needed for the piezoelectric multiplexer 100.

Flexible wires 182a, 182b, 184a, 184b, 186a and 186b are bonded to contact heads 112, 512, 114, 514, 116 and 516, respectively. These wires contain enough slack, in one embodiment, to allow the contact heads to reach conducting head 124, and such slack will cause the wires to bend in a certain direction when the bimorph beams are upright. To reduce arcing, high-pass filters are coupled to the inputs 152a-b, 154a-b and 156a-b and output 160. Specifically, capacitor 242 is connected between ground and inputs 152a and 152b. Capacitor 244 is connected between ground and inputs 154a and 154b. Capacitor 248 is connected between ground and inputs 156a and 156b. And capacitor 246 is connected between ground and output 160. Capacitors 242-248 function as high-pass filters and reduce arcing by dissipating transient voltages at the contact heads 112-116, 512-516 and the conducting head 124.

Though not shown for the sake of clarity, another embodiment will include damping capacitors between the actuator contact 140 and the bimorph beam contacts 132-136/532-536. Individual capacitors may be used for each bimorph beam 102-106 and 502-506, or a single capacitor can be used for each bimorph beam pair 102/502, 104/504 and 106/506. In the latter embodiment, one end of a capacitor will be connected to the actuator contact 140 and the other end will be connected to both beam contacts of the bimorph beam pair, e.g., contacts 132/532, 134/534 and 136/536.

Various modifications to the embodiments disclosed herein may be made without departing from the scope of the present disclosure and the claims provided below. The subject matter of the present invention is described with specificity herein to meet statutory requirements. The claimed subject matter might also be embodied in other ways, to include different steps or combinations of steps similar to the ones described herein, in conjunction with other present or future technologies.

What is claimed is:

1. A switching element, comprising:
    an actuator with an actuator conducting head and an actuator stem;
    a plurality of bimorph beams positioned in parallel to the actuator stem, each bimorph beam comprising a beam contact head made of a conductive material and a beam stem made of a bimorph material; and
    a plurality of electrical contacts coupled to the beam stems and the actuator stem for receiving a selectively applied control voltage applied across a first bimorph stem and the actuator stem and causing a selected bimorph beam to physically move toward the actuator and create an electrical connection between the conducting head and the beam contact head of the selected bimorph beam.

2. The switching element of claim 1, wherein the plurality of bimorph beams are positioned in a geometric pattern surrounding the actuator.

3. The switching element of claim 2, wherein the geometric pattern comprises a triangle, square, rectangle, circle, trapezoid, pentagon, or hexagon, and the actuator is positioned in the middle of the bimorph beams.

4. The switching element of claim 1, wherein the actuator and the plurality of bimorph beams are etched out of a dielectric layer.

5. The switching element of claim 4, wherein the electrical contacts are electrically coupled to the bimorph beams through a conducting pathway or connecting via through the dielectric layer.

6. The switching element of claim 1, further comprising a circuit configured to selectively apply the control voltage to the plurality of bimorph beams.

7. The switching element of claim 6, wherein the circuit comprises:
    a controller generating a selection signal indicating the selected bimorph beam, and
    a demultiplexer receiving the control voltage and the selection signal and providing the control voltage to the electrical contact associated with the selected bimorph beam indicated in the selected signal.

8. The switching element of claim 1, wherein the electrical connection allows an input current received at the beam contact head of the selected bimorph beam to pass through the actuator conducting head.

9. The switching element of claim 1, further comprising a transistor, wherein the conducting head of the actuator is electrically coupled to a first terminal of the transistor.

10. The switching element of claim 9, further comprising a second switching element with a second actuator electrically coupled to a second terminal of the transistor.

11. A system comprising:
    a piezoelectric multiplexer, comprising:
        an actuator with an actuator conducting head and an actuator stem; and
        a plurality of bimorph beams having a plurality of electrical contacts, each bimorph beam comprising a beam contact head made of a conductive material and a beam stem made of a bimorph material; and a circuit configured to selectively apply a control voltage to one of the plurality of bimorph beams for causing the beam stem of the selected bimorph beam to move toward the actuator and cause the beam contact head of the selected bimorph beam to create an electrical connection with the actuator conducting head.

12. The system of claim 11, wherein the bimorph beams and the actuator are oriented upright with the actuator stem positioned parallel to the bimorph beam stems.

13. The system of claim 11, wherein the actuator comprises an actuator contact, and the circuit applies the control voltage across the electrical contact of the selected bimorph beam and the actuator contact.

14. The system of claim 11, further comprising a plurality of capacitors coupled to the actuator contact and the electrical contacts.

15. The system of claim 11, wherein the circuit is further configured to stop applying the control voltage to the selected bimorph beam and then apply the control voltage to a different bimorph beam.

16. The system of claim 11, wherein application of the control voltage to the selected bimorph beam creates a piezoelectric effect that bends the beam stein of the selected bimorph beam.

17. The system of claim 11, wherein the circuit comprises:
a controller generating a selection signal indicating the selected bimorph beam, and
a demultiplexer receiving the control voltage and the selection signal and providing the control voltage to the electrical contact associated with the selected bimorph beam indicated in the selection signal.

18. The system of claim 11, wherein the electrical connection allows an input current to pass through the beam contact head and the actuator conducting head.

19. The system of claim 11, further comprising a transistor, wherein the conducting head of the actuator is electrically coupled to a first terminal of the transistor.

20. The system of claim 19, further comprising a second transistor with a terminal and a second piezoelectric multiplexer with a second actuator, wherein the second actuator is electrically coupled to the terminal of the second transistor.

21. The system of claim 11, further comprising one or more barriers forcibly bending the bimorph beams not receiving the control voltage toward the actuator.

22. The system of claim 11, further comprising:
an electrical component having a first connection terminal electrically coupled to the actuator conducting head of the piezoelectric multiplexer; and
a plurality of voltage, or current nodes electrically coupled to the plurality of electrical contacts of the bimorph beams, wherein each of the electrical contacts is selectively movable into contact with the actuator conducting head to couple one of the voltage or current nodes to the first terminal through application of the control voltage to at least one of the bimorph beams.

23. The system of claim 22, wherein the electrical component is a transistor.

24. The system of claim 23, further comprising:
a second piezoelectric multiplexer electrically coupled to a second connection terminal of the transistor and having a second actuator and a second plurality of bimorph beams that are physically movable toward the second actuator upon application of the control voltage, wherein the piezoelectric multiplexer is electrically coupled to the collector of the transistor and the second piezoelectric multiplexer is electrically coupled to the base or emitter of the transistor.

25. The system of claim 23, further comprising a third piezoelectric multiplexer electrically coupled to a third connection terminal of the transistor and having a third actuator and a third plurality of bimorph beams that are physically movable toward the third actuator upon application of the control voltage, wherein the piezoelectric multiplexer is electrically coupled to the source of the transistor, the second piezoelectric multiplexer is electrically coupled to the gate of the transistor, and the third piezoelectric multiplexer is electrically coupled to the drain of the transistor.

26. The system of claim 22, wherein the electrical component is at least one member of a diode, a capacitor, an inductor, a resistor, a transformer, a bridge rectifier, and a thyristor.

27. A switching element, comprising:
an actuator with an actuator conducting head and an actuator stem;
a first and second plurality of bimorph beams positioned around the actuator stem, wherein each of the bimorph beams of the first and second plurality of bimorph beams includes a beam contact head made of a conductive material and a beam stem made of a bimorph material, and
a plurality of electrical contacts coupled to the beam stems and the actuator stem for receiving a selectively applied control voltage causing either the first or second plurality of bimorph beams to physically move toward the actuator and create electrical connections between the conducting lead and the beam contact heads of the selected first or second plurality of bimorph beams.

28. The switching element of claim 27, wherein the first plurality of bimorph beams comprise a first pair of bimorph beams and the second plurality of bimorph beams comprise a second pair of bimorph beams.

29. The switching element of claim 27, further comprising a plurality of capacitors coupled between the electrical contact of the actuator stem and the electrical contacts of the first and second plurality of bimorph beams.

30. The switching element of claim 27, further comprising a controller configured to select either the first or second plurality of bimorph beams to apply the control voltage.

* * * * *

UNITED STATES PATENT AND TRADEMARK OFFICE
CERTIFICATE OF CORRECTION

PATENT NO. : 8,860,284 B1
APPLICATION NO. : 14/048981
DATED : October 14, 2014
INVENTOR(S) : Babak Fahimi et al.

Page 1 of 1

It is certified that error appears in the above-identified patent and that said Letters Patent is hereby corrected as shown below:

In the Specification:

At column 7, line number 3, please replace [ (a) ] with -- ($\alpha$) --.

In the Claims:

At column 11, claim number 16, line number 25, please replace the word [ stein ] with -- stem --.

At column 12, claim number 27, line number 42, please replace the word [ lead ] with -- head --.

Signed and Sealed this
Sixth Day of January, 2015

Michelle K. Lee
*Deputy Director of the United States Patent and Trademark Office*